(12) United States Patent
Iou

(10) Patent No.: US 7,733,014 B2
(45) Date of Patent: Jun. 8, 2010

(54) ORGANIC ELECTRO-LUMINESCENCE DIODE

(75) Inventor: Chung-Yeh Iou, Taichung Hsien (TW)

(73) Assignee: Au Optronics Corp., Hsinchu (TW)

( * ) Notice: Subject to any disclaimer, the term of this patent is extended or adjusted under 35 U.S.C. 154(b) by 1233 days.

(21) Appl. No.: 11/284,013

(22) Filed: Nov. 22, 2005

(65) Prior Publication Data

US 2006/0186793 A1 Aug. 24, 2006

(30) Foreign Application Priority Data

Feb. 18, 2005 (TW) .............................. 94104786 A

(51) Int. Cl.
*H05B 33/00* (2006.01)
(52) U.S. Cl. ..................................................... 313/506
(58) Field of Classification Search .................. 313/506
See application file for complete search history.

(56) References Cited

U.S. PATENT DOCUMENTS

| 2003/0170491 A1 | 9/2003 | Liao et al. .................... 428/690 |
| 2006/0087225 A1* | 4/2006 | Liao et al. .................... 313/504 |

* cited by examiner

*Primary Examiner*—Nimeshkumar D. Patel
*Assistant Examiner*—Anthony T Perry
(74) *Attorney, Agent, or Firm*—Thomas, Kayden, Horstemeyer & Risley

(57) ABSTRACT

An organic electro-luminescence diode comprises two electrodes and an organic electro-luminescence structure. The organic electro-luminescence structure is formed between the two electrodes, and includes a red light-generating unit, a green light-generating unit, a blue light-generating unit and a light-compensating unit stacked with each other. The light-compensating unit is selected from the group consisting of a white light-compensating unit, a red light-compensating unit, a green light-compensating unit, a blue light-compensating unit and a structure stacking together one light-compensating unit upon the other.

6 Claims, 5 Drawing Sheets

ORGANIC ELECTRO-LUMINESCENCE DIODE

BACKGROUND OF THE INVENTION (1) Field of the Invention

The invention relates to an organic electro-luminescence diode, especially to an organic light-emitting diode having serially stacked red, green, and blue light-generating units.

(2) Description of the Related Art

Two ways for conventional multicolor organic light-emitting diode (OLED) to generate three primary color light are that arranging red (R) green (G), and blue (B) light-generating units side by side, and combining a white light-generating unit with color filters. However, side by side patterns used in a manufacturing process of a flat panel will cause shadow effect. The shadow effect can be avoided by the other way such as combining the white light-generating unit with color filters, but the color filters may reduce the light intensity.

FIG. 1A shows a first type of conventional OLED panel with side by side patterns. R, G, and B light-generating units 20 are disposed side by side on a substrate 10. Each light-generating unit includes a hole injecting layer (HIL) 22, a hole transport layer (HTL) 23, an emission layer (EL) 24, an electron transport layer (ETL) 25 and an electron injecting layer (EIL) 26 sandwiched between two electrodes 21a and 21b. First of all, the electrode 21b used as an anode is formed on the substrate 10. Subsequently, the HIL 22, the HTL 23, the EL 24, the ETL 25 and the EIL 26 are formed on the electrode 21b in order. Finally, the electrode 21a is formed on the EIL 26 as a cathode. Referring to FIG. 1B, when different color ELs 24 are evaporated on the substrate 10, they are aligned for deposited on accuracy site by adjusting evaporating angle θ. The different evaporating angle θ causes ELs 24 evaporated non-uniformly in overall panel, and results in shadow effect.

FIG. 1C shows a second type of conventional OLED having a white light-generating unit with color filters. A red color filter layer 11, a green color filter layer 12 and a blue color filter layer 13 are formed on the substrate 10, and a white light-generating unit 20a is located on the three color filter layers 11, 12, and 13. As described in U.S. Pat. No. 6,696,177, the light-generating unit 20a can produce white light by a blue emission layer 201 containing an yellow fluorescence material. Because the light-generating units 20a in this type of OLED are not disposed side by side, the shadow effect does not occur. However, the luminance will be reduce due to the light going through the color filters 11, 12, and 13. Because different color lights have different luminance attenuation ratio, the luminescent efficiency of the blue light-generating unit and that of the red light-generating unit are usually lower than that of the green light.

In order to improve the disadvantages of forgoing two type of OLED, the inventor provides an OLED having serially stacked RGB light-generating units.

SUMMARY OF THE INVENTION

Accordingly, the object of the invention is to provide an OLED for higher light intensity, higher luminescent efficiency and purer white light by serially stacked red, green, blue and additional white light-generating units, any one of which includes an emission layer sandwiched between a hole injecting/transport layer and an electron injecting/transport layer.

The present invention provides an organic light-emitting diode comprising two electrodes and an organic electro-luminescence structure. The organic electro-luminescence structure is sandwiched between the two electrodes, and includes a red light-generating unit, a green light-generating unit, a blue light-generating unit and a light-compensating unit stacked with each other. The light-compensating unit is selected from the group consisting of a white light-compensating unit, a red light-compensating unit, a green light-compensating unit, a blue light-compensating unit and combinations thereof.

Besides, a charge generating layer is interposed between any two adjacent light-generating units or between one light-compensating unit and its adjacent light-generating unit. When the light-compensating unit includes a series of the white light-compensating units, the red light-compensating units, the green light-compensating units, the blue light-compensating units or their combinations, the charger generating layers can be also interposed between any two adjacent light-compensating units.

When the white light-compensating unit is added, the luminescent efficiency of the OLED is improved to emit more saturated red, green and blue light. If the red light-compensating unit or the blue light-compensating unit are added, the intensity of the red and blue light emitting from the OLED is sufficient to balance with green light, so as to generate purer white light. Thus, the OLED device should be bright, efficient, and generally have Commission International de l'Eclairage (CIE) chromaticity coordinates of about [0.33, 0.33].

BRIEF DESCRIPTION OF THE DRAWINGS

The present invention will now be specified with reference to its preferred embodiment illustrated in the drawings, in which.

DESCRIPTION OF THE PREFERRED EMBODIMENTS

Figure 1A:
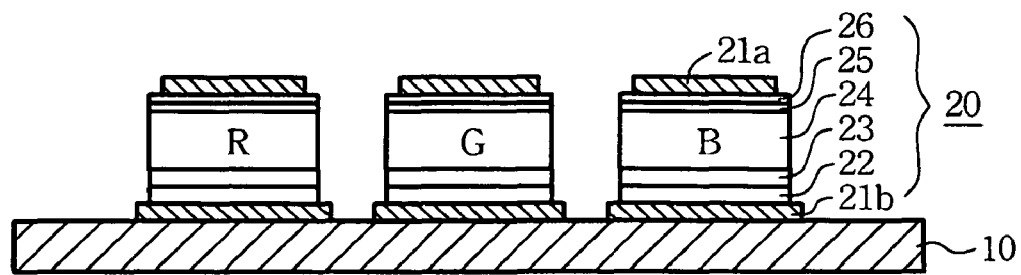
FIG. 1A is a chart showing the convention OLED panel having RGB light-generating units disposed side by side.
Figure 1B:
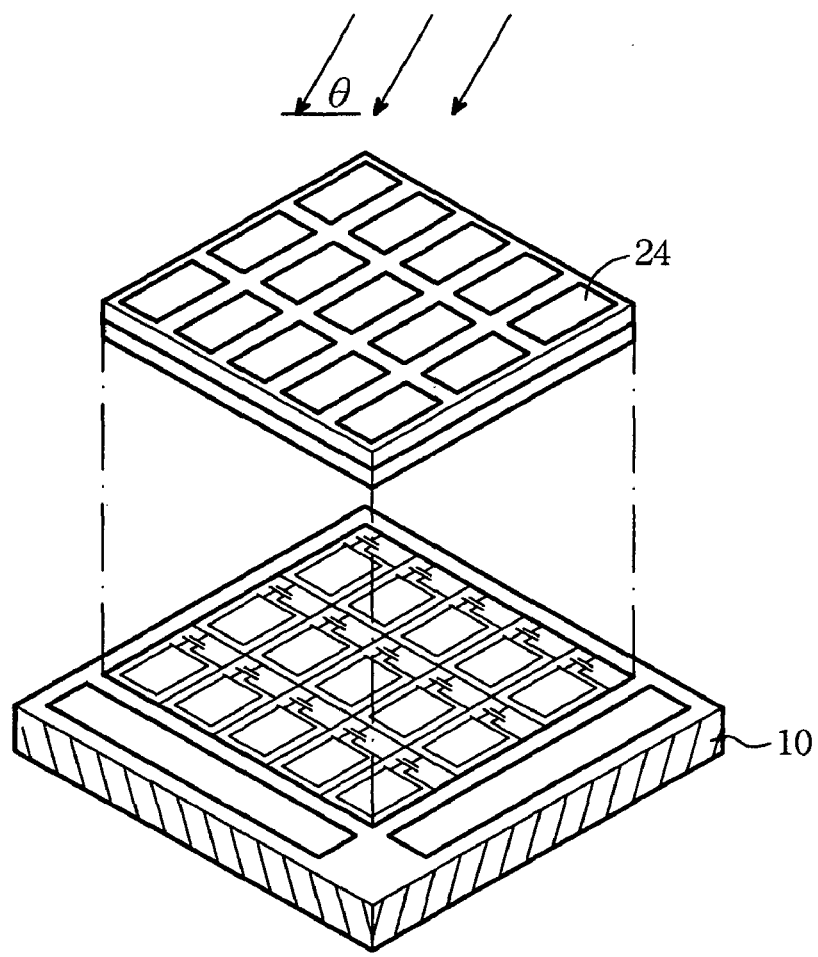
FIG. 1B is a chart showing the evaporating process of the OLED in FIG. 1A.
Figure 1C:
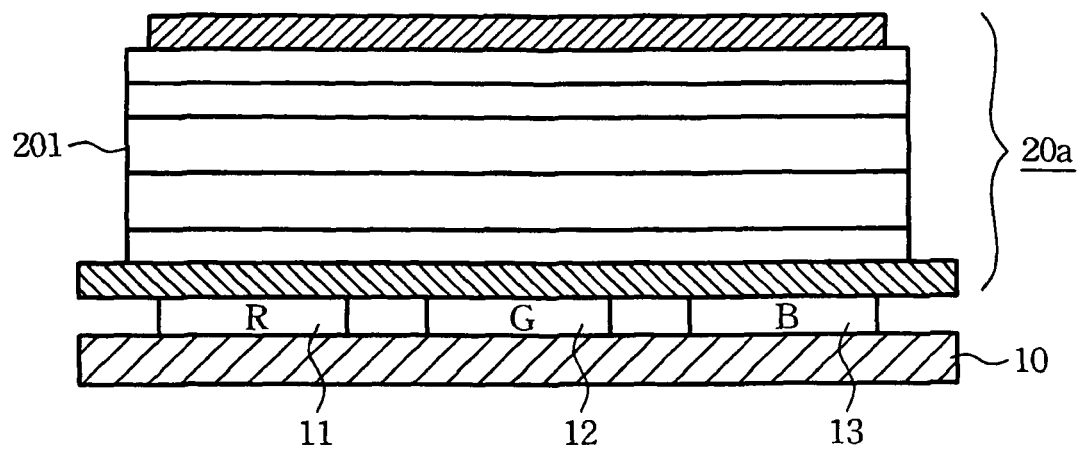
FIG. 1C is a chart showing the convention OLED panel having a white light-generating unit with color filters.
Figure 2:
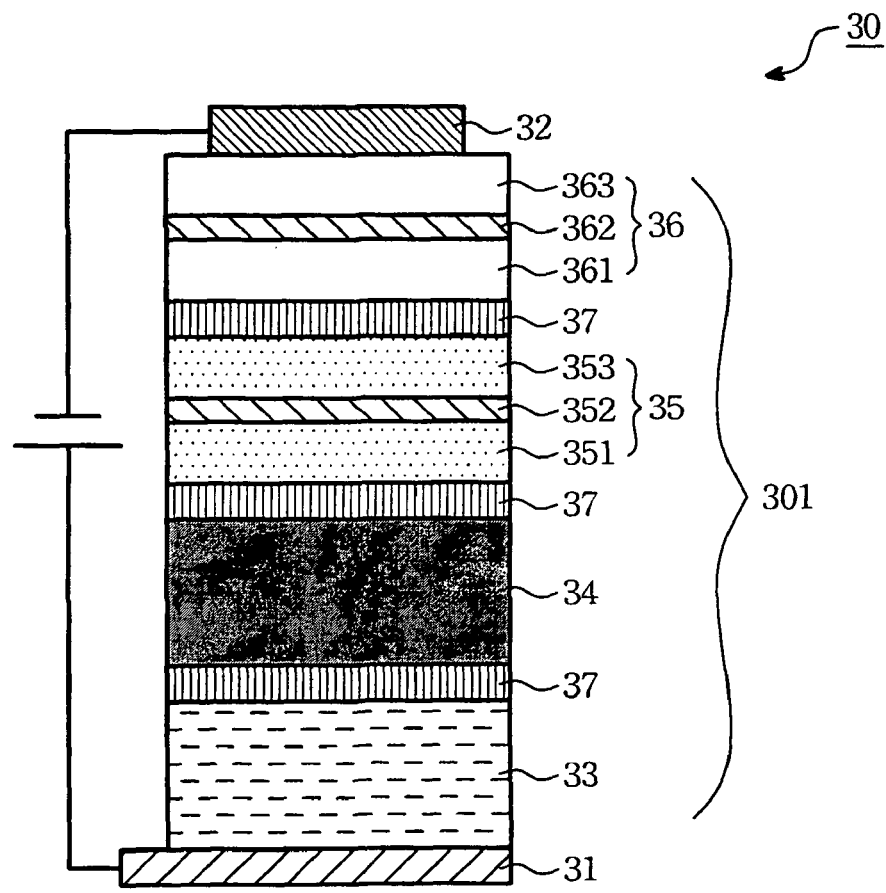
FIG. 2 is a chart showing the OLED according to the invention.

Referring to FIG. 2, the organic light-emitting diode 30 according to the invention comprises two electrodes 31 and 32 and an organic electro-luminescence structure 301. The organic electro-luminescence structure 301 is sandwiched between two electrodes 31 and 32, and includes a red light-generating unit 35, a green light-generating unit 34, a blue light-generating unit 33 and a light-compensating unit 36, all of which are stacked with each other.

As shown in FIG. 2, the blue light-generating unit 33 is formed on the electrode 31 and combined with the green light-generating unit 34 through a charge generating layer 37. Likewise, the green light-generating unit 34 is combined with the red light-generating unit 35 through the charge generating layer 37. The red light-generating unit 35 is still combined with the light-compensating unit 36 through the charge generating layer 37. Besides, the OLED 30 of the present invention may include a white light-generating unit (not shown) that is selectively stacked with any other light-generating units 33, 34 and 35 and the light-compensating unit 36. On top of the light-compensating unit 36 is the other electrode 32. These light-generating units or the light-compensating unit can be made up of a hole injecting layer, a hole transport layer, an emission layer, an electron transport layer and an electron injecting layer. For example, the light-compensating unit 36 has a hole injecting/transport layer 361, an emission layer 362 and an electron injecting/transport layer 363. The difference between this invention and related art is that all units in the organic electron-luminescence structure 301 are stacked with each other, and the light-compensating unit 36 is added in this invention. Specially, the light-compensating unit 36 is selected from a group consisting of a white light-compensating unit, a red light-compensating unit, a green light-compensating unit, a blue light-compensating unit and combinations thereof. In addition, the stacking order for these light-generating units and the light-compensating unit is not necessary to limit.

Figure 3:
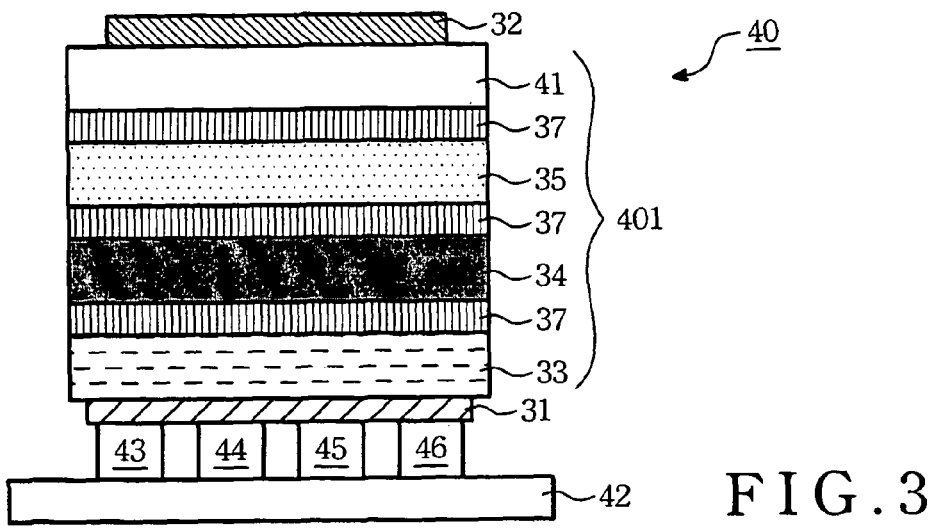
FIG. 3 is a chart showing a first embodiment of the OLED according to the invention.

Referring to FIG. 3, the first preferred embodiment of this invention is shown. A red color filter layer 43, a green color filter layer 44, a blue color filter layer 45 and a transparent layer 46 are deposited side by side on a substrate 42. An OLED 40 is on these layers 43, 44, 45 and 46. In order to enhance the light intensity, the luminescent efficiency and the saturation, the white light-compensating unit 41 is selected to eliminate the color shift. As shown, an organic electro-luminescence structure 401 is constituted of the white light-compensating unit 41, the red light-generating unit 35, the green light-generating unit 34 and the blue light-generating unit 33. These charge generating layers 37 should be interposed between any two adjacent light-generating units or between white light-compensating unit 41 and its adjacent light-generating unit, such as the red light-generating unit 35. The charge generating layer 37 has the function of conducting current by holes and electrons generating from an oxidation/reduction reaction.

Figure 4:
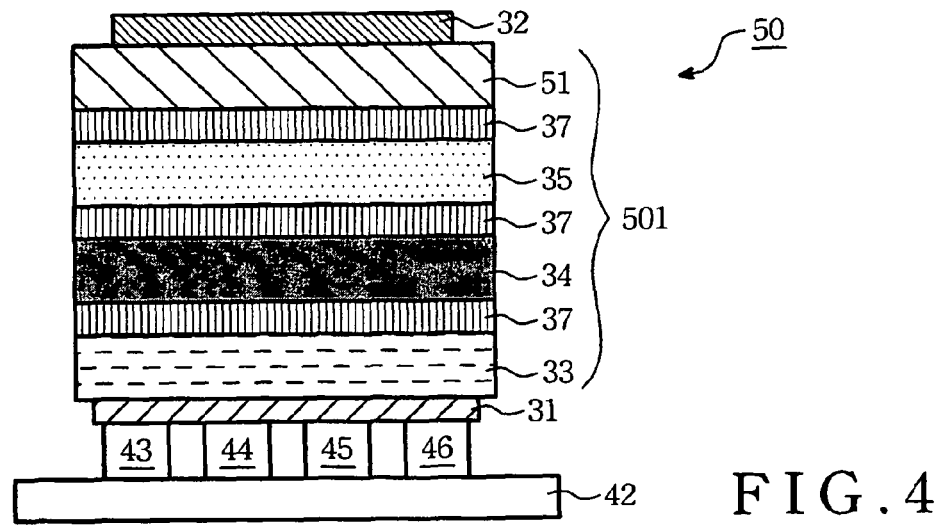
FIG. 4 is a chart showing a second embodiment of the OLED according to the invention.

Referring to FIG. 4, the second preferred embodiment of this invention is shown. When the white light that is generated by mixing the lights emitting from the red light-generating unit 35, the green light-generating unit 34 and the blue light-generating unit 33 shifts to blue-green, a red light-compensating unit 51 is selected to eliminate the color shift. So an organic electro-luminescence structure 501 is constituted of the red light-compensating unit 51, the red light-generating unit 35, the green light-generating unit 34 and the blue light-generating unit 33. These charge generating layers 37 should be interposed between any two adjacent light-generating units or between the red light-compensating unit 51 and its adjacent light-generating unit. The most suitable position of the red light-compensating unit 51 is adjacent to the red light-generating unit 35.

Figure 5:
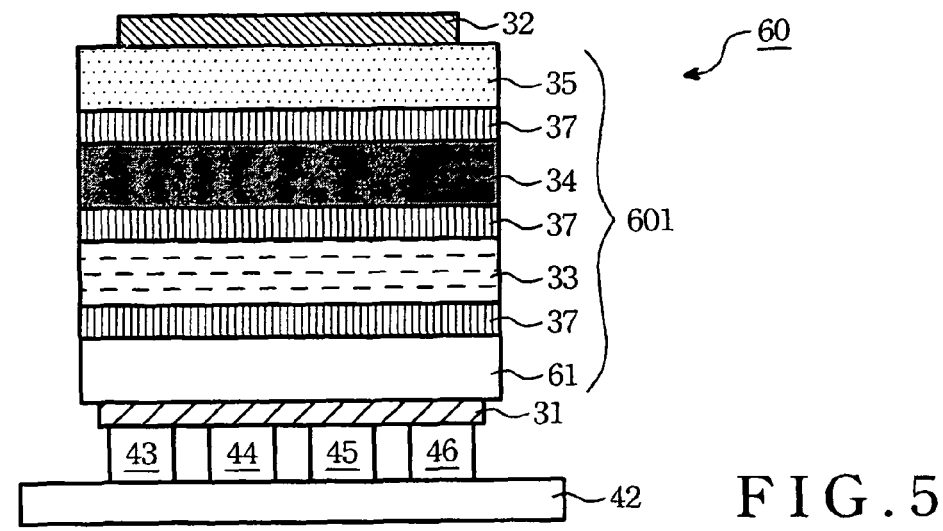
FIG. 5 is a chart showing a third embodiment of the OLED according to the invention.

Referring to FIG. 5, the third preferred embodiment of this invention is shown. When the white light shifts to red, a blue light-compensating unit 61 is selected to eliminate the color shift. So an organic electro-luminescence structure 601 is constituted of the blue light-compensating unit 61, the red light-generating unit 35, the green light-generating unit 34 and the blue light-generating unit 33. These charge generating layers 37 should be interposed between any two adjacent light-generating units or between the blue light-compensating unit 61 and its adjacent light-generating unit. The most suitable position of the blue light-compensating unit 61 is adjacent to the blue light-generating unit 33.

FIG. 2 to FIG. 5 explain that if the color shift is not serious, only one mono-color light-compensating unit is sufficient to eliminate the color shift by adjusting the red, green and blue light in an intensity ratio of from 1:1:1 to 1:2:1.

Figure 6:
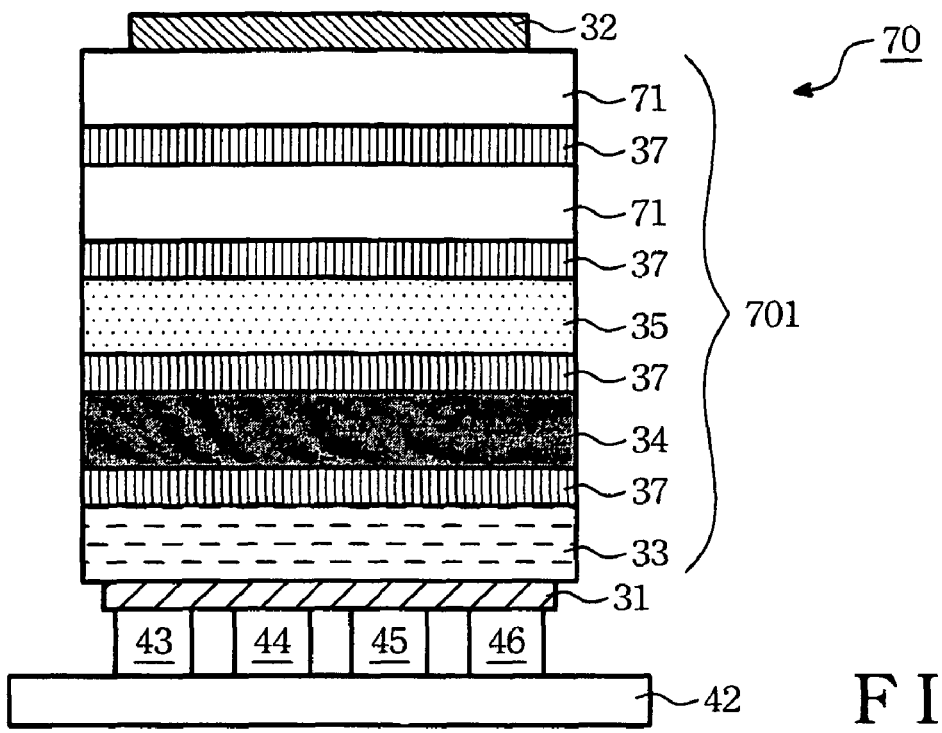
FIG. 6 is a chart showing a fourth embodiment of the OLED according to the invention.

Referring to FIG. 6, the fourth preferred embodiment of this invention is shown. When the white light shifts to blue-green, a red light-compensating unit 71 is selected to eliminate the color shift. However, if only one red light-compensating unit 71 can not balance the intensity of red, green and blue light, other red light-compensating units 71 will be added in the OLED 70. As shown, there are two red light-compensating unit 71, one red light-generating unit 35, one green light-generating unit 34 and one blue light-generating unit 33 sandwiched between a pair of electrode 31 and 32. These charge generating layers 37 are interposed between two red light-compensating units 71, between any two adjacent light-generating units or between one red light-compensating unit 71 and its adjacent light-generating unit. The most suitable position of the red light-compensating unit 71 is adjacent to the red light-generating unit 35. Two to four red light-compensating units 71 are suitable in this embodiment. In other words, an organic electro-luminescence structure 701 has two to four serial red emission layers to compensate the luminance and the saturation of the red light.

Figure 7:
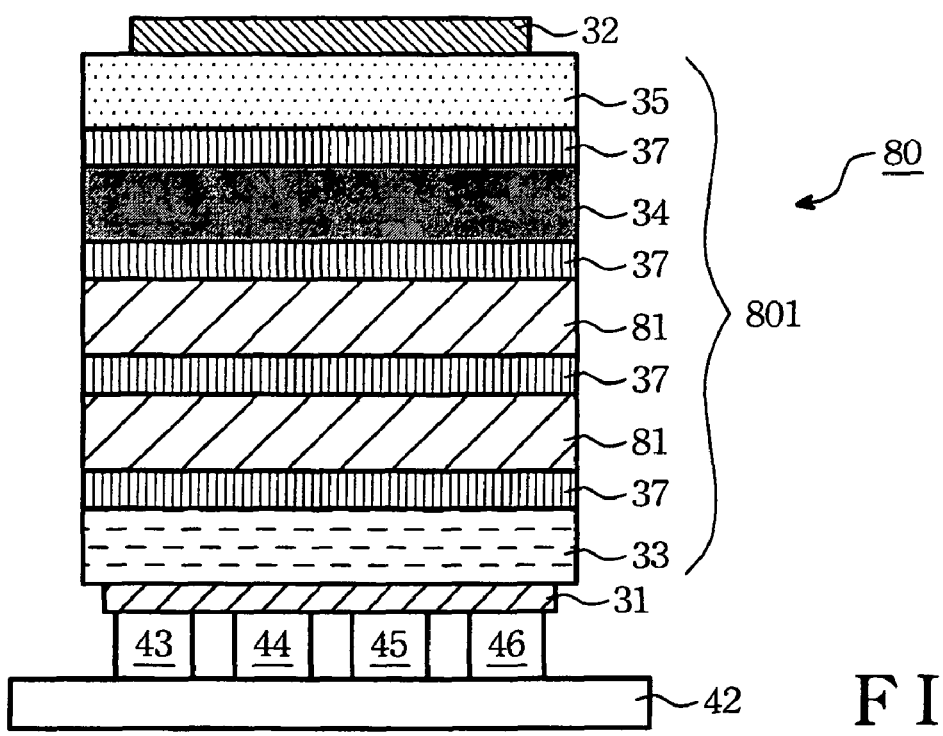
FIG. 7 is a chart showing a fifth embodiment of the OLED according to the invention.

Referring to FIG. 7, the fifth preferred embodiment of this invention is shown. When the white light shifts to red, a blue light-compensating unit 81 is selected to eliminate the color shift. As shown, there are a plurality of blue light-compensating unit 81, one red light-generating unit 35, one green light-generating unit 34 and one blue light-generating unit 33 sandwiched between a pair of electrode 31 and 32. These charge generating layers 37 are interposed between any two blue light-compensating units 81, between any two adjacent light-generating units, or between one of the blue light-compensating units 81 and its adjacent light-generating unit. The most suitable position of the blue light-compensating unit 81 is adjacent to the blue light-generating unit 33. Two to four blue light-compensating units 81 are adapted to this embodiment for example. In other words, the organic electro-luminescence structure 801 has two to four serial red emission layers to compensate the luminance and the saturation of the blue light.

FIG. 6-7 are different from FIG. 2-5 because of a plurality of mono-color light-compensating units for adjusting the red, green and blue light in an intensity ratio of from 1:1:1 to 1:2:1. The number requirement of the light-compensating units varies with the factors such as different electrode materials, different hole injecting/transport layer materials, different electron injecting/transport layer materials or emission layers, because the different materials give rise to deviation of the light intensity.

Figure 8:
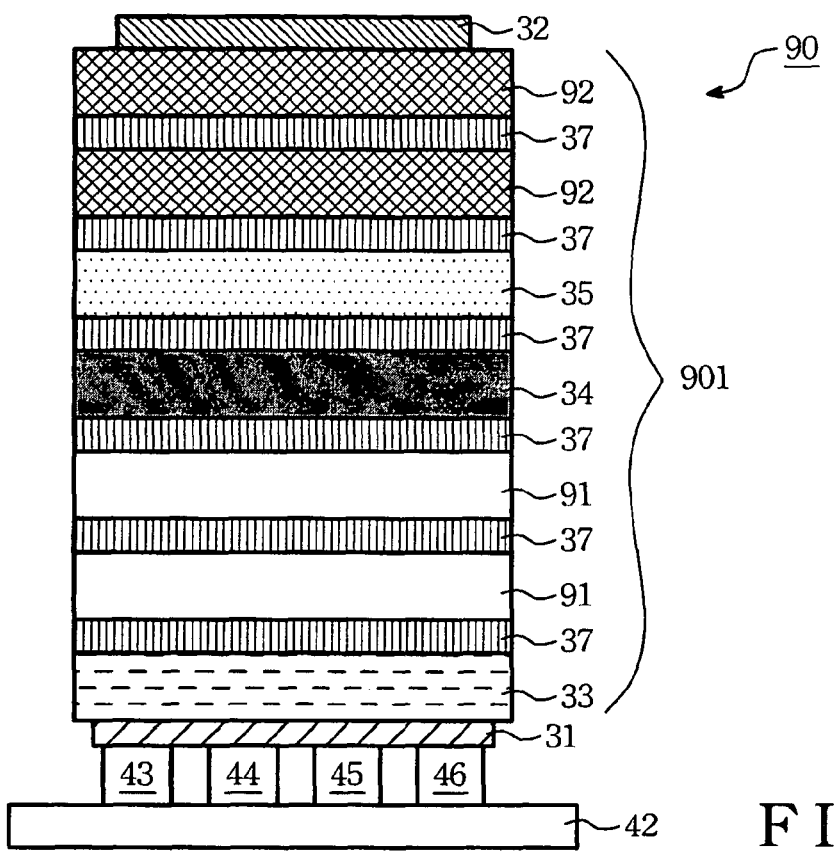
FIG. 8 is a chart showing a sixth embodiment of the OLED according to the invention.

Referring to FIG. 8, the sixth preferred embodiment of this invention is shown. When the white light shifts to green, a blue light-compensating unit 91 and a red light-compensating unit 92 are selected to eliminate the color shift. There are a plurality of blue light-compensating units 91, one red light-generating unit 35, one green light-generating unit 34, one blue light-generating unit 33 and a plurality of red light-compensating units 92 sandwiched between two electrode 31 and 32. These charge generating layers 37 are interposed between any two adjacent blue light-compensating units 91, between any two adjacent red light-compensating units 92, between any two adjacent light-generating units or between one light-compensating unit and its adjacent light-generating unit. The most suitable position of the blue light-compensating unit 91 is adjacent to the blue light-generating unit 33, and the most suitable position of the red light-compensating unit 92 is adjacent to the red light-generating unit 35. Two to four blue light-compensating units 91 or two to four red light-compensating units 92 are adapted to this embodiment. Therefore, an organic electro-luminescence 901 has two to four serial red emission layers or two to four serial blue emission layers.

Figure 9:
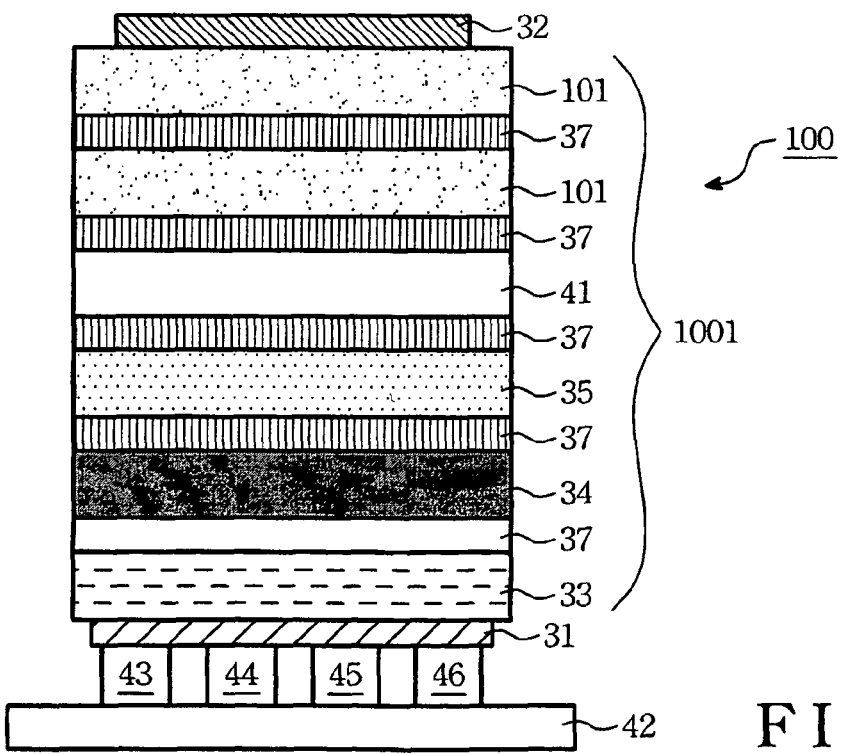
FIG. 9 is a chart showing a seventh embodiment of the OLED according to the invention.

Referring to FIG. 9, the seventh preferred embodiment of this invention is shown. When the intensity of the light from the red, green and blue light-generating units are not sufficient, the white light-generating unit 101 or the white light-compensating unit 41 are, added selectively to enhance the light intensity and saturation. There are one white light-generating unit 101, one red light-generating unit 35, one green light-generating unit 34, one blue light-generating unit 33 and a plurality of white light-compensating units 41 between two electrode 31 and 32. These charge generating layers 37 are interposed between any two adjacent white light-compensating units 41, between any two adjacent light-generating units or between one light-compensating unit and its adjacent light-generating unit. The most suitable position of the white light-compensating unit 41 is adjacent to the white light-generating unit 101. Two to four white light-compensating units 41 are adapted to this embodiment. Therefore, an organic electro-luminescence structure 1001 has two to four serial white emission layers.

By the way, the red light-generating unit, the green light-generating unit and the blue light-generating unit can be stacked in any order in aforementioned embodiments. These color filter layers can be formed between the OLED and the substrate, or the surface of the substrate opposite to the OLED. The OLED emits red, green and blue light in a best light intensity ratio of 1:2:1. The red light-generating unit and the red light-compensating unit can be made from the same or different materials. The blue light-generating unit and the blue light-compensating unit can be made from the same or different materials. The blue light-generating unit and the blue light-compensating unit can be made from the same or different materials.

The present invention also provides a method for manufacturing an OLED according to the invention comprising the steps of: providing a first electrode; forming and serially stacking a plurality of light-generating units, at least one light-compensating unit and at least one charge generating layer on the first electrode, wherein the charge generating layer is disposed between these light-generating units; and forming a second electrode on the light-compensating unit, these light-generating units and these charge generating layers. The light-generating units can include one red light-generating unit, one green light-generating unit, one blue light-generating unit and one white light-generating unit.

If the organic electro-luminescence structure has a plurality of red light-compensating units, the steps of forming the light-compensating unit further include a step of forming a plurality of red emission layers, for example, two to four red emission layers are suitable. If the organic electro-luminescence structure has a plurality of blue light-compensating units, the steps of forming the light-compensating unit further include a step of forming a plurality of blue emission layers, for example, two to four blue emission layers are suitable. The organic layers in the light-generating units or the light-compensating units, such as the hole injecting layer, the hole transport layer, the emission layer, the electron transport layer and the electron injecting layer can be deposited by evaporating. The electron injecting layer can be doped with n-dopant to increase the number of electrons, and the hole injecting layer can be doped with p-dopant to increase the number of holes. The electrodes can be made by evaporating or sputtering for example.

Characteristics and advantages of the invention are listed:
1. Enhancing the luminescent efficiency and balancing the green light to produce purer white light.
2. Longer life for the OLED.
3. Compensating luminance attenuation.
4. No alignment in evaporating process, and no shadow effect.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

I claim:

1. An organic electro-luminescence diode comprising:
   two electrodes; and
   an organic electro-luminescence structure disposed between said two electrodes, comprising:
      a red light-generating unit;
      a green light-generating unit;
      a blue light-generating unit, wherein said three light-generating units are stacked with each other;
      at least one charge generating layer disposed between said light-generating units; and
      at least one light-compensating unit stacked with said light-generating units, wherein said light-compensating unit includes at least one white emission layer.

2. The organic electro-luminescence diode of claim 1, wherein said light-compensating unit includes a hole injecting layer, a hole transport layer, an emission layer, and a electron transport layer stacked sequentially.

3. The organic electro-luminescence diode of claim 1, wherein said at least one charge generating layer is disposed between said at least one light-compensating unit and said light-generating unit adjacent to said at least one light-compensating unit.

4. A method for manufacturing an organic electro-luminescence diode, comprising:
   providing a first electrode;
   forming and serially stacking a plurality of light-generating units, at least one light-compensating unit and at least one charge generating layer on the first electrode, wherein said at least one charge generating layer is disposed between said light-generating units, wherein the step of forming said at least one light-compensating unit further includes forming at least one white emission layer; and
   forming a second electrode on said at least one light-compensating unit, said light-generating units, and said charge generating layer.

5. The method of claim 4, wherein the step of forming said at least one charge generating layer further includes forming a plurality of charge generating layers between said light-generating units.

6. The method of claim 4, wherein at least one of said light-generating units includes a red light-generating unit, a green light-generating unit, or a blue generating-unit.

* * * * *